(12) United States Patent
Kang

(10) Patent No.: US 8,085,600 B2
(45) Date of Patent: Dec. 27, 2011

(54) PROGRAM AND VERIFY METHOD OF NONVOLATILE MEMORY DEVICE

(75) Inventor: Young Su Kang, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 423 days.

(21) Appl. No.: 12/372,337

(22) Filed: Feb. 17, 2009

(65) Prior Publication Data

US 2009/0285026 A1 Nov. 19, 2009

(30) Foreign Application Priority Data

May 13, 2008 (KR) .......................... 10-2008-0044119

(51) Int. Cl.
*G11C 16/06* (2006.01)

(52) U.S. Cl. ......... 365/185.25; 365/185.23; 365/185.24; 365/185.22; 365/203; 365/230.03; 365/230.06

(58) Field of Classification Search ............. 365/185.25, 365/185.23, 185.24, 185.22, 203, 230.03, 365/230.06
See application file for complete search history.

(56) References Cited

U.S. PATENT DOCUMENTS

| | | | | |
|---|---|---|---|---|
| 5,214,610 A * | 5/1993 | Houston | ..................... | 365/233.5 |
| 5,566,127 A * | 10/1996 | Hoshizaki | ................ | 365/230.06 |
| 6,418,075 B2 * | 7/2002 | Shimano et al. | .............. | 365/227 |
| 6,462,584 B1 * | 10/2002 | Proebsting | ....................... | 327/52 |
| 6,731,540 B2 * | 5/2004 | Lee et al. | ................. | 365/185.17 |
| 7,042,779 B2 * | 5/2006 | Dudeck et al. | ................ | 365/203 |
| 7,180,786 B2 * | 2/2007 | Mastrangelo et al. | ... | 365/185.23 |
| 7,272,058 B2 * | 9/2007 | Murakoshi et al. | ........... | 365/200 |
| 7,304,892 B2 * | 12/2007 | Lee | ........................... | 365/185.18 |
| 7,315,472 B2 * | 1/2008 | Lee | ........................... | 365/185.17 |
| 7,379,351 B2 * | 5/2008 | Kwon et al. | .............. | 365/189.06 |
| 7,443,733 B2 * | 10/2008 | Park | ........................ | 365/185.23 |
| 7,551,492 B2 * | 6/2009 | Kim | ........................ | 365/185.29 |
| 7,787,299 B2 * | 8/2010 | Won et al. | ................ | 365/185.11 |
| 7,800,955 B2 * | 9/2010 | Won et al. | ................ | 365/185.22 |

FOREIGN PATENT DOCUMENTS

KR 100713992 B1 4/2007

OTHER PUBLICATIONS

Notice of Preliminary Rejection issued from Korean Intellectual Property Office on Oct. 22, 2009.

* cited by examiner

*Primary Examiner* — Viet Q Nguyen

(74) *Attorney, Agent, or Firm* — IP & T Group LLP

(57) ABSTRACT

A program and verify method of a nonvolatile memory device, which can minimize the time taken for program and verify operations. The program and verify method includes precharging an output terminal of a block selector to a second level, making the output terminal of the block selector float, and, in the state where the output terminal floats, sequentially applying a program voltage and a verify voltage through a global word line.

5 Claims, 4 Drawing Sheets

PROGRAM AND VERIFY METHOD OF NONVOLATILE MEMORY DEVICE

CROSS-REFERENCE TO RELATED APPLICATION

The present application claims priority to Korean patent application number 10-2008-0044119, filed on May 13, 2008, which is incorporated by reference in its entirety.

BACKGROUND OF THE INVENTION

The present invention relates to a program and verify method of a nonvolatile memory device.

In recent years, there has been an increasing demand for nonvolatile memory devices which can be electrically programmed and erased and do not need the refresh function of rewriting data at specific intervals.

A nonvolatile memory device generally includes a memory cell array in which cells for storing data therein are arranged in matrix form, and a page buffer for writing memory into specific cells of the memory cell array or reading memory stored in a specific cell. The page buffer includes a bit line pair connected to a specific memory cell, a register for temporarily storing data to be written into a memory cell array, or reading data of a specific cell from the memory cell array and temporarily storing the read data therein, a sense node for sensing the voltage level of a specific bit line or a specific register, and a bit line selection unit for controlling whether or not to connect a specific bit line to the sense node.

In a program operation of this nonvolatile memory device, a verify operation for determining whether programming has been completed is also performed. That is, a program voltage and a verify voltage are applied sequentially, and this operation is performed repeatedly until the program operation is completed. The program voltage and the verify voltage are applied in such a manner that an output voltage of the block selector is precharged and therefore voltage applied to a global word line is transferred to a local word line. However, the conventional method includes an operation for precharging the output voltage of the block selector whenever the program voltage and the verify voltage are applied. Consequently, a problem arises because an overall program time and verification time increases.

BRIEF SUMMARY OF THE INVENTION

The present invention is directed towards a program and verify method of a nonvolatile memory device, which can minimize the time taken for program and verify operations.

A program and verify method of a nonvolatile memory device according to an aspect of the present invention includes precharging an output terminal of a block selector to a second level, making the output terminal of the block selector floating, and, in the state where the output terminal is floating, sequentially applying a program voltage and a verify voltage through a global word line.

DESCRIPTION OF SPECIFIC EMBODIMENTS

Now, specific embodiments according to the present invention will be described with reference to the accompanying drawings. However, the present invention is not limited to the disclosed embodiments, but may be implemented in various ways. The embodiments are provided to complete the disclosure of the present invention and to allow those having ordinary skill in the art to understand the scope of the present invention. The present invention is defined by the category of the claims.

Figure 1:
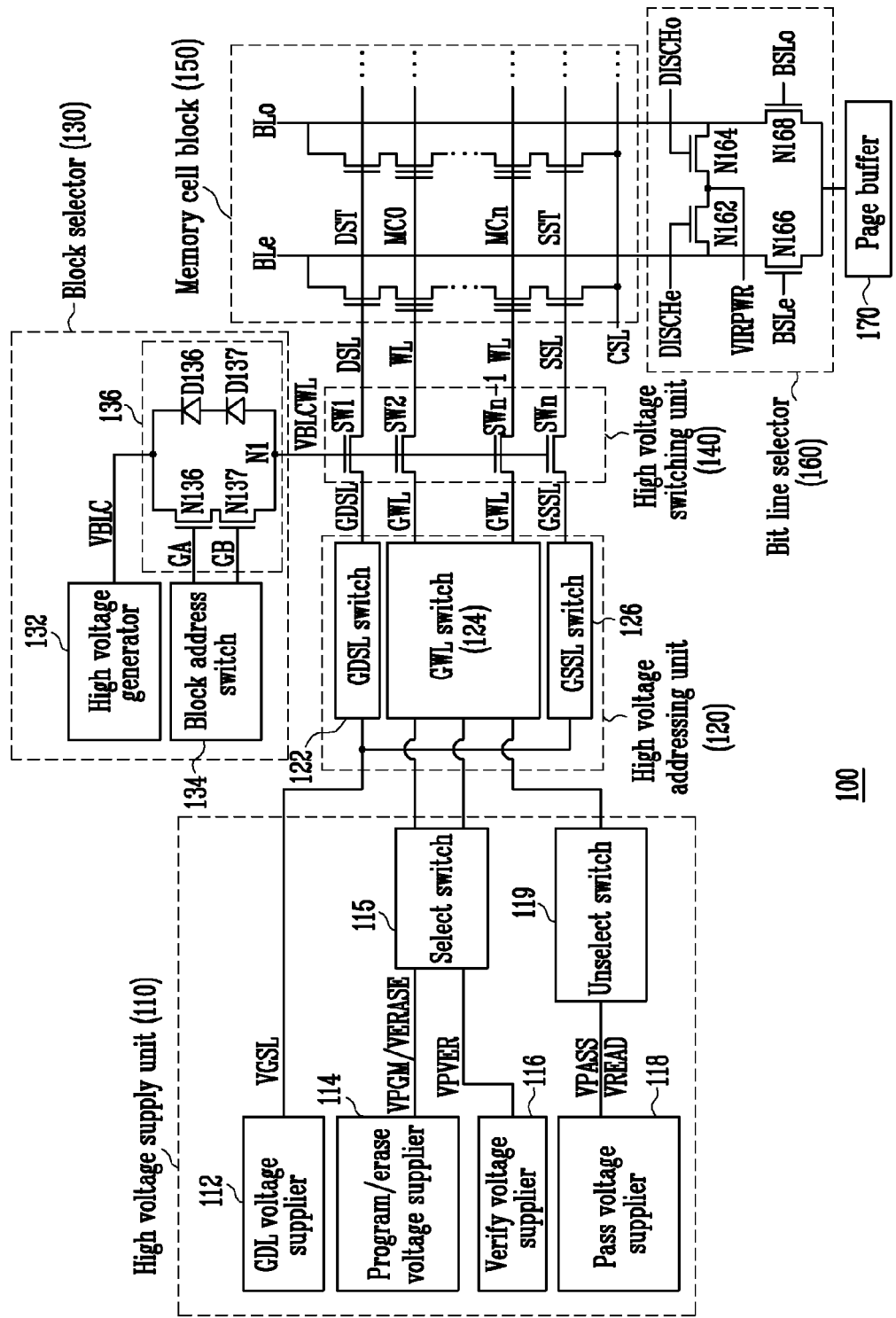
FIG. 1 is a circuit diagram showing a nonvolatile memory device to which the present invention is applicable.

FIG. 1 is a circuit diagram showing a nonvolatile memory device to which the present invention is applicable.

A nonvolatile memory device 100 includes a memory cell block 150 for storing various data, a high voltage supply unit 110 for generating various high voltages and supplying them to respective word lines, a drain select line or a source select line of the memory cell block, a high voltage addressing unit 120 for selectively transferring the respective high voltages, a high voltage switching unit 140 for cutting off high voltages, which have passed through the high voltage addressing unit 120, or having the high voltages pass therethrough according to whether a specific block has been selected or not, and a block selector 130 for outputting a block select voltage VBLCWL, which controls whether to operate the high voltage switching unit 140, according to whether a specific block has been selected.

The nonvolatile memory device 100 further includes a page buffer 170 for temporarily storing data to be programmed into a memory cell block or temporarily storing data read from a memory cell block during an operation of the nonvolatile memory device 100, and a bit line selector 160 for connecting a specific one of a pair of bit lines BLe, BLo of the memory cell block to the page buffer 170.

Each of the constituent elements is described in more detail.

The memory cell block 150 refers to a memory cell, on a block basis, of a memory cell array. The unit memory cell block 150 includes a plurality of memory cell strings in each of which a drain select transistor DST, a plurality of memory cells MC0 to MCn, and a source select transistor SST are connected in series.

The bit line selector 160 includes a NMOS transistor N166 for connecting the even bit line BLe and a sensing node (not shown) in response to a first bit line select signal BSLe, and a NMOS transistor N168 for connecting the odd bit line BLo and the sensing node in response to a second bit line select signal BSLo.

The bit line selector 160 further includes a variable voltage input terminal VIRPWR for applying a variable voltage of a specific level, a NMOS transistor N162 for connecting the even bit line BLe and the variable voltage input terminal in response to a first discharge signal DISCHe, and a NMOS transistor N164 for connecting the odd bit line BLo and the variable voltage input terminal in response to a second discharge signal DISCHo. Through this configuration, a specific bit line is selectively coupled to the page buffer 170.

The high voltage supply unit 110 generates various high voltages, which are necessary for program, read, erase, and verify operations of the nonvolatile memory device, and supplies them to the nonvolatile memory device.

The high voltage supply unit 110 includes a program/erase voltage supplier 114, a verify voltage supplier 116, a pass voltage supplier 118, and a GDL voltage supplier 112. The program/erase voltage supplier 114 generates a program voltage VPGM supplied to a selected word line during the program operation and an erase voltage VERASE supplied to the entire word lines of a corresponding block during the erase operation. The verify voltage supplier 116 generates a verify voltage VPVER supplied to a selected word line during the verify operation. The pass voltage supplier 118 generates a read voltage VREAD supplied to a selected word line during the read operation and a pass voltage VPASS supplied to unselected word lines during each operation. The GDL voltage supplier 112 generates voltages to turn on the drain select transistor and the source select transistor during each operation. The high voltage supply unit 110 further includes a select switch 115 for switching the program voltage/the verify voltages supplied to a selected word line, and an unselect switch 119 for switching the pass voltage supplied to unselected word lines.

Each of the voltage suppliers includes a charge pump circuit (not shown) for pumping an external power supply voltage to a specific level and a regulator circuit (not shown) for regulating a pumping voltage to a constant level. The respective suppliers have different levels of voltages supplied thereto according to use of each operation, but entirely have a configuration for regulating a pumping voltage.

The high voltage addressing unit 120 selectively supplies the transferred high voltages per on a word-line basis. That is, in the case of program/read/verify voltages, voltage is supplied to a specific word line selected from the entire word lines, and the high voltage addressing unit 120 performs an addressing operation of the word lines.

To this end, the high voltage addressing unit 120 includes a GDSL switch 122 for receiving the GDL voltage and supplying the GDL voltage to a global drain select line GDSL coupled to the drain select transistor, a GSSL switch 126 for receiving the GDL voltage and supplying the GDL voltage to a global source select line GSSL of the source select transistor, and a GWL switch 124 for supplying program/erase/verify/read/pass voltages, etc. to global word lines GWL coupled to a specific cell.

The high voltage switching unit 140 cuts off various high voltages transferred from the high voltage addressing unit 120 or has the various high voltages pass therethrough according to whether the memory cell block has been selected. In performing the program/erase/verify/read operations, etc., in the case in which a specific block is selected, the high voltage switching unit 140 has the respective high voltages pass therethrough so that the voltages can be supplied to respective local word lines LWL and, in the case in which a specific block is not selected, the high voltage switching unit 140 cuts off the respective high voltages.

To this end, the high voltage switching unit 140 includes cut-off transistors SW1 to SWn respectively connected between the global voltage supply lines GDSL, GSSL, and GWL and a memory cell of the memory cell block, and gates of the drain/source select transistors.

Here, each cut-off transistor consists of a NMOS transistor, which is turned on in response to the block select voltage VBLCWL output from the block selector 130.

Each of the cut-off transistors SW1 to SWn is turned on according to a boosting phenomenon, which is caused by voltage supplied from each of the global voltage supply lines GDSL, GSSL, and GWL, in the state where the block select voltage VBLCWL applied to each gate of the drain/source select transistors is floated. For example, in the state where the gate is floated, if a high voltage (a program voltage of approximately 16V) is applied through the global voltage supply line GWL, the cut-off transistors SW1 to SWn are turned on by a coupling effect, so that the high voltage is applied to the local word line LWL.

The block selector 130 generates the block select voltage VBLCWL according to whether the memory cell block 150 has been selected and transfers the generated block select voltage VBLCWL to the high voltage switching unit 140.

To this end, the block selector 130 includes a high voltage generator 132 for supplying a high voltage VBLC to be used as a block select voltage, a block switch 136 for transferring the high voltage VBLC to the high voltage switching unit 140 according to whether a specific block has been selected, and a block address switch 134 fro addressing the block switch according to whether a specific block has been selected.

The block switch 136 includes, as shown in FIG. 1, first and second NMOS transistors N136, N137 and first and second diodes D136, D137. The first and second NMOS transistors N136, N137 are turned on in response to a first control signal GA and a second control signal GB, respectively, and connected in series between the high voltage generator 132 and an output node N1. The first and second diodes D136, D137 are connected in series between the high voltage generator 132 and the output node N1.

An operation of the block selector 130 in a typical program verify operation is now described.

Figure 2:
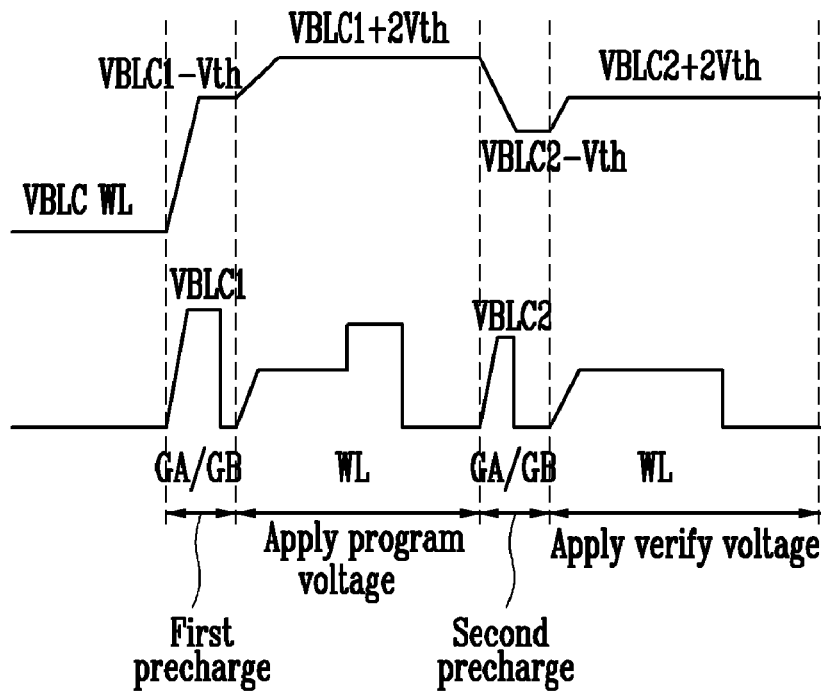
FIG. 2 shows a waveform illustrating an operation of a block selector in a typical program verify operation of a nonvolatile memory device.

FIG. 2 shows a waveform illustrating an operation of the block selector in a typical program verify operation of a nonvolatile memory device.

First, when the first and second control signals GA, GB of a first level VBLC1 are applied to turn on the first and second NMOS transistors N136, N137, the output node N1 is precharged to a second level (VBLC1−Vth).

Next, when the application of the first and second control signals GA, GB is stopped, the output node N1 enters a floating state. Here, if a program voltage transferred through the global word line GWL is applied to the drain terminal of the cut-off switch SW, the voltage of the output node N1 rises due to a self-boosting effect caused by drain-gate overlap capacitance. Thus, each cut-off switch SW is turned on, so the global word line (GWL) voltage is transferred to the local word line LWL. Meanwhile, the voltage VBLCWL of the output node N1 does not rise higher than a third level (VBLC1+2Vth) because of the first and second diodes D136, D137. Through this operation, the program voltage is supplied to each local word line.

Thereafter, when the first and second control signals GA, GB of a fourth level VBLC2 are supplied again to thereby turn on the first and second NMOS transistors N136, N137, the output node N1 shifts to a fifth level (VBLC2−Vth).

Next, when the application of the first and second control signals is stopped, voltage of the output node N1 rises up to a sixth level (VBLC2+2Vth) according to the above-mentioned self-boosting effect. Through this operation, the verify voltage is supplied to each local word line.

Typically, the program operation is executed according to the incremental step pulse program (ISPP) method. An operation of applying a program voltage according to the application of the first and second control signals of the first level and an operation of applying a verify voltage according to the application of the first and second control signals of the fourth level are performed repeatedly.

However, as the MLC program method is generalized, there is a tendency that the number of verify operations, which should be performed after the program operation, is increased. Accordingly, the time taken for the verify operation is increased, which makes it necessary to reduce the number of verify operations.

Figure 3:
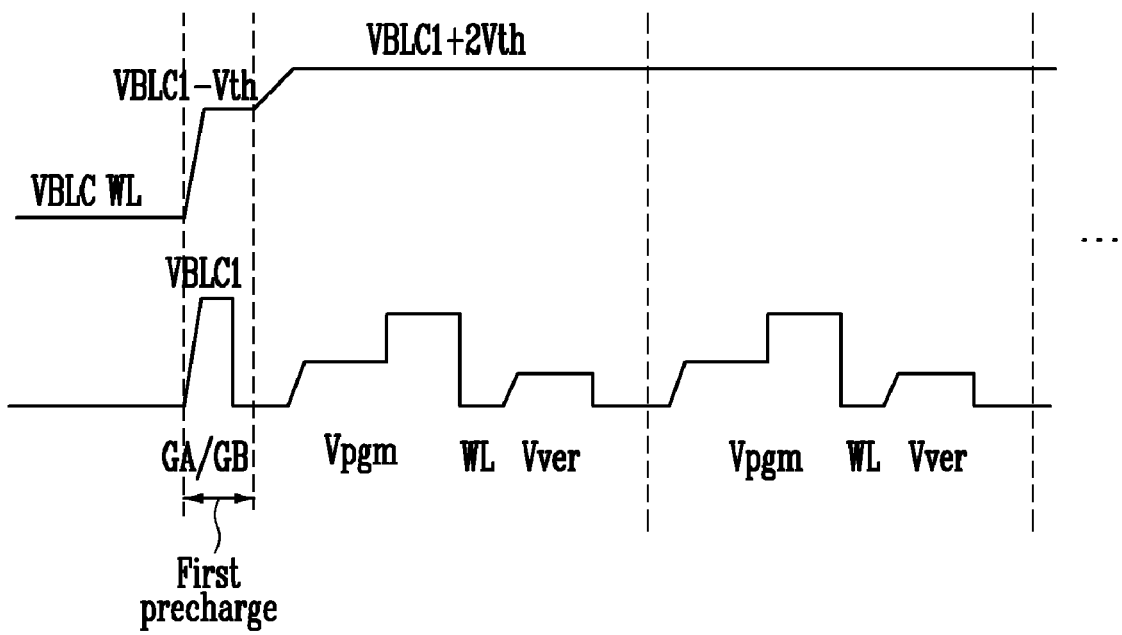
FIG. 3 shows a waveform illustrating an operation of a block selector in a program verify operation of a nonvolatile memory device in accordance with an embodiment of the present invention.

FIG. 3 shows a waveform illustrating an operation of the block selector in the program verify operation of the nonvolatile memory device in accordance with an embodiment of the present invention.

First, when the first and second control signals GA, GB of the first level VBLC1 are applied to turn on the first and second NMOS transistors N136, N137, the output node N1 is precharged to a second level (VBLC1−Vth).

Next, when the application of the first and second control signals GA, GB is stopped, the output node N1 becomes a floating state. Here, a program voltage Vpgm and a verify voltage Vver are sequentially applied through the global word line GWL, and the program operation and the verify operation are executed. Unlike the prior art, an additional second precharge operation is not performed before the verify voltage is applied.

After a first precharge operation is completed, the output node N1 is in a floating state. Thus, voltage of the output node N1 is boosted according to voltage applied through the global word line GWL. Accordingly, each cut-off switch of the high voltage switching unit 140 is turned on and, therefore, the verify voltage Vver can be applied to each word line even without the second precharge operation before the verify voltage Vver is applied. In a similar way, in the case in which the program operation and the verify operation are subsequently repeated, the program voltage and the verify voltage are applied through the global word line without a precharge operation of the block switch. Meanwhile, although it has been shown as if there is no change in the voltage of the output node N1, it is evident to those skilled in the art that the output node N1 may have a different level according to voltage applied through the global word line GWL since the output node N1 is in a floating state.

Figure 4:
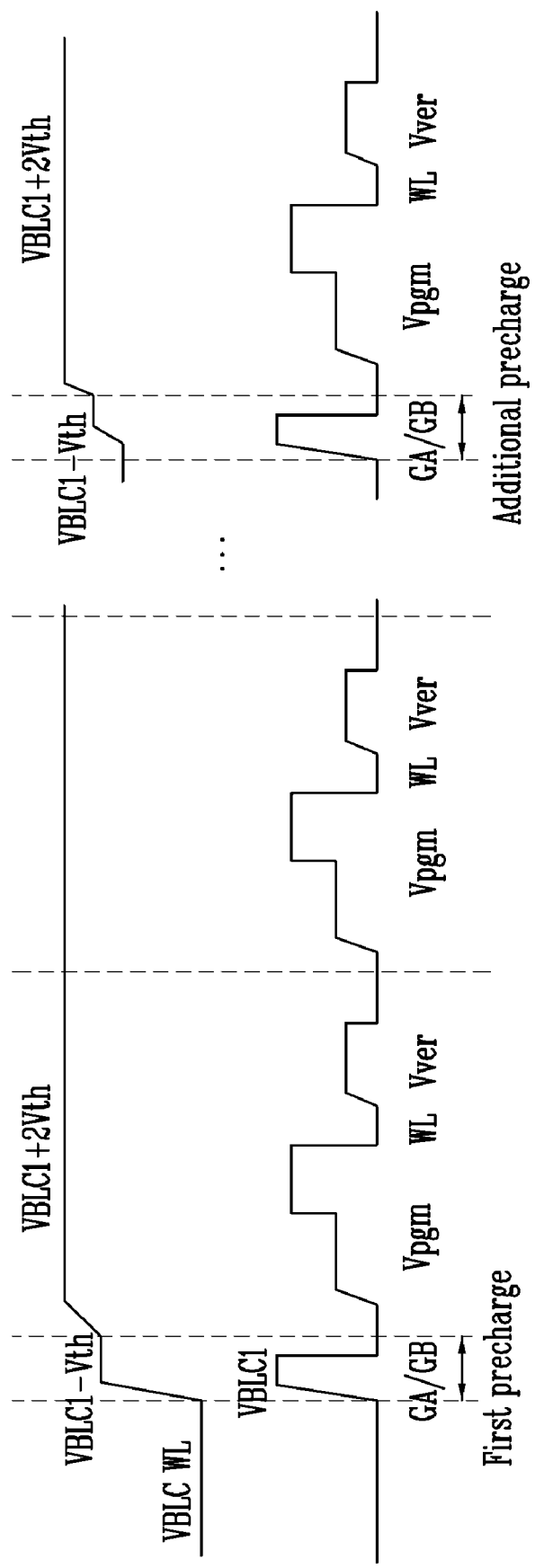
FIG. 4 shows a waveform illustrating an operation of a block selector in a program verify operation of a nonvolatile memory device in accordance with another embodiment of the present invention.

FIG. 4 shows a waveform illustrating an operation of the block selector in the program verify operation of the nonvolatile memory device in accordance with another embodiment of the present invention.

In this embodiment, when the block select voltage VBLCWL is discharged according to external conditions such as the leakage current, the discharged block select voltage is sensed and an additional precharge operation is performed.

First, when the first and second control signals GA, GB of the first level VBLC1 are applied to turn on the first and second NMOS transistors N136, N137, the output node N1 is precharged to a second level (VBLC1−Vth).

Next, when the application of the first and second control signals GA, GB is stopped, the output node N1 becomes a floating state. Here, a program voltage Vpgm and a verify voltage Vver are sequentially applied through the global word line GWL, and the program operation and the verify operation are executed.

After a first precharge operation is completed, the output node N1 is in a floating state. Thus, voltage of the output node N1 is boosted according to voltage applied through the global word line GWL. Accordingly, each cut-off switch of the high voltage switching unit 140 is turned on and, therefore, the verify voltage Vver can be applied to each word line even without the second precharge operation before the verify voltage Vver is applied. In a similar way, in the case in which the program operation and the verify operation are subsequently repeated, the program voltage and the verify voltage are applied through the global word line without a precharge operation of the block switch.

Thereafter, when the block select voltage VBLCWL is discharged according to external conditions such as the leakage current, the discharged block select voltage is sensed and an additional precharge operation is performed. This is described in detail below with reference to FIG. 5.

Figure 5:
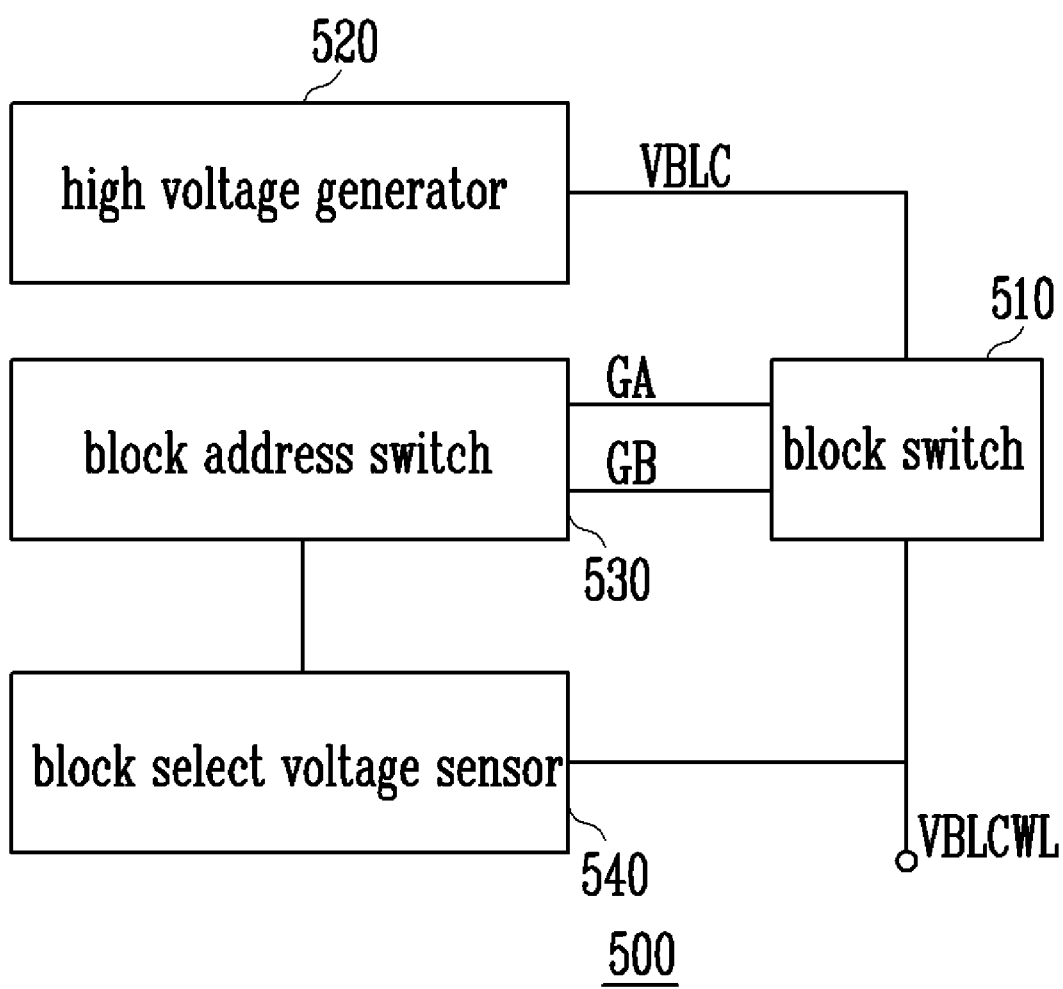
FIG. 5 is a block diagram of a block selector in accordance with an embodiment of the present invention.

FIG. 5 is a block diagram of a block selector in accordance with an embodiment of the present invention.

A block selector 500 includes a high voltage generator 520 for supplying the high voltage VBLC to be used as the block select voltage VBLCWL, a block switch 510 for transferring the high voltage VBLC to the high voltage switching unit according to whether a specific block has been selected, a block address switch 530 for addressing the block switch according to whether a specific block has been selected, and a block select voltage sensor 540 for sensing the level of the block select voltage VBLCWL, that is, the output of the block switch 510 and transferring a sensed voltage level to the block address switch 530.

The block select voltage sensor 540 senses the moment when the block select voltage VBLCWL is discharged to a specific voltage level and therefore enables the block address switch 530 to output the first and second control signals GA, GB of the first level VBLC1. To this end, the block select voltage sensor 540 includes a comparator (not shown) for comparing a reference voltage having a predetermined level and an amount of the block select voltage VBLCWL.

When the block select voltage VBLCWL is discharged below a specific voltage, the block address switch 530 outputs the first and second control signals GA, GB of the first level VBLC1 so that the block select voltage VBLCWL is precharged to the second level (VBLC1−Vth) again.

As described above, when the block select voltage VBLCWL is discharged, an additional precharge operation is performed such that the block select voltage VBLCWL keeps higher than the second level (VBLC1+2Vth). Thereafter, the program operation and the verify operation are repeatedly performed as described above.

In accordance with the above configuration, after the output terminal of the block selector is initially precharged once, the program operation and the verify operation are performed without an additional precharge operation. Accordingly, the time taken for the entire program and verify operations can be reduced.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A program and verify method of a nonvolatile memory device, comprising:
 precharging an output terminal of a block selector to a second level by applying first and second control signals of a first level, which is higher than the second level, to a block switch;
 making the output terminal of the block selector float; and
 applying a program voltage and a verify voltage sequentially through a global word line in the state where the output terminal floats.

2. The program and verify method of claim 1, further comprising sequentially applying the program voltage and the verify voltage until a program operation is completed.

3. The program and verify method of claim 1, wherein the floating of the output terminal of the block selector includes stopping application of first and second control signals to the block switch.

4. The program and verify method of claim 1, wherein the sequential application of the program voltage and the verify voltage includes:
   boosting voltage of the output terminal of the block selector to a third level according to the application of the program voltage;
   turning on a high voltage switching unit according to the boosted voltage of the output terminal; and
   transferring voltage of the global word line to a local word line.

5. The program and verify method of claim 1, further including, when voltage of the output terminal of the block selector shifts to a critical value or less, repeating the precharging of the output terminal of the block selector to the second level.

* * * * *